(12) United States Patent
Huang et al.

(10) Patent No.: US 12,550,345 B2
(45) Date of Patent: Feb. 10, 2026

(54) SEMICONDUCTOR STRUCTURE

(71) Applicant: National Tsing Hua University, Hsinchu (TW)

(72) Inventors: Chih-Fang Huang, Hsinchu (TW); Jia-Wei Hu, Taipei (TW); Fu-Jen Hsu, Zhubei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 352 days.

(21) Appl. No.: 18/174,356

(22) Filed: Feb. 24, 2023

(65) Prior Publication Data

US 2023/0275161 A1    Aug. 31, 2023

(30) Foreign Application Priority Data

Sep. 19, 2022    (TW) .................................. 111135421

(51) Int. Cl.
*H10D 8/60*    (2025.01)
*H10D 30/66*    (2025.01)
*H10D 84/00*    (2025.01)

(52) U.S. Cl.
CPC .............. *H10D 8/60* (2025.01); *H10D 30/668* (2025.01); *H10D 84/146* (2025.01)

(58) Field of Classification Search
CPC ...... H10D 8/60; H10D 30/668; H10D 84/146; H10D 8/605; H10D 30/635; H10D 64/23; H10D 62/107; H10D 64/117; H10D 64/647

See application file for complete search history.

(56) References Cited

U.S. PATENT DOCUMENTS

| | | | |
|---|---|---|---|
| 7,772,668 B2 * | 8/2010 | Pan ..................... | H10D 30/0297 257/E29.257 |
| 8,507,978 B2 * | 8/2013 | Bhalla ................. | H10D 64/117 257/77 |
| 9,269,779 B2 * | 2/2016 | Deng ................. | H10D 30/0297 |
| 10,468,519 B2 | 11/2019 | Huang et al. | |

(Continued)

FOREIGN PATENT DOCUMENTS

| | | |
|---|---|---|
| TW | 200921792 | 5/2009 |
| TW | 201113951 | 4/2011 |
| TW | 201523892 | 6/2015 |

*Primary Examiner* — Steven B Gauthier
*Assistant Examiner* — Khatib A Rahman
(74) *Attorney, Agent, or Firm* — MUNCY, GEISSLER, OLDS & LOWE, P.C.

(57) ABSTRACT

A semiconductor structure includes a Schottky diode structure, which includes: a first trench extending through a first N-type semiconductor layer and being disposed in the first N-type semiconductor layer; a first insulating layer disposed in the first trench; two polysilicon layers or metal silicide layers disposed in the first trench, wherein an upper one and a lower one of the polysilicon layers or metal silicide layers are disposed in parallel; a first P-type protective layer, which is grounded and disposed on a bottom of the first trench, and contacts the first insulating layer and a bottom surface of the lower one of the polysilicon layers or metal silicide layers; a metal layer respectively disposed as a top surface and a lower bottom surface of the semiconductor structure to form a source and a drain as electrodes for the semiconductor structure to be connected to an external device.

14 Claims, 13 Drawing Sheets

(56) References Cited

U.S. PATENT DOCUMENTS

| | | | |
|---|---|---|---|
| 2010/0032790 A1 | 2/2010 | Rinehimer | |
| 2011/0169075 A1* | 7/2011 | Hsieh | H10D 30/665 |
| | | | 438/270 |
| 2011/0254088 A1* | 10/2011 | Darwish | H10D 30/0297 |
| | | | 257/341 |
| 2016/0359029 A1* | 12/2016 | Zeng | H10D 64/518 |
| 2018/0308975 A1 | 10/2018 | Ohse et al. | |
| 2018/0315848 A1* | 11/2018 | Huang | H10D 62/307 |
| 2019/0109228 A1 | 4/2019 | Kobayashi et al. | |
| 2019/0259870 A1* | 8/2019 | Meiser | H01L 21/0495 |
| 2019/0348510 A1 | 11/2019 | Yilmaz | |
| 2020/0303507 A1 | 9/2020 | Yilmaz | |
| 2020/0312997 A1* | 10/2020 | Nagata | H10D 64/2527 |

\* cited by examiner

SEMICONDUCTOR STRUCTURE

CROSS-REFERENCE TO RELATED APPLICATIONS

This application claims priorities of Nos. 111107094 and 111135421 respectively filed in Taiwan R.O.C. on Feb. 25, 2022 and Sep. 19, 2022 under 35 USC 119, the entire contents of which are hereby incorporated by reference.

BACKGROUND OF THE INVENTION

Field of the Invention

This disclosure relates to a semiconductor structure, and more particularly to a semiconductor structure having a Schottky diode.

Description of the Related Art

A Schottky diode is a diode element constituted by a metal-semiconductor interface, and has a unidirectional communication property like a typical PN junction diode. Because the Schottky diode has the unipolar mobility, the Schottky diode has a starting voltage lower than a PN diode element, and a response speed higher than the PN diode element upon forward-reverse bias switching. So, the Schottky diode is particularly applied to the occasions where the low power consumption and improved switching speed are required, and is frequently used in a power conversion circuit, such as a structure integrating a MOSFET and the Schottky diode together. In the prior art, the Schottky diode is externally connected to the MOSFET device in parallel to function as a rectifier. However, when the Schottky diode is connected to the MOSFET in parallel, a parasitic inductance generated by the external connection is increased to decrease the performance, and the external Schottky diode has the higher cost.

BRIEF SUMMARY OF THE INVENTION

This disclosure discloses a semiconductor structure including: a Schottky diode structure. The Schottky diode structure includes: a first N-type semiconductor layer, a first trench, a first insulating layer, at least two polysilicon layers or metal silicide layers, a first P-type protective layer and a metal layer. The first trench extends through the first N-type semiconductor layer and is disposed in the first N-type semiconductor layer. The first insulating layer is disposed in the first trench. The at least two polysilicon layers or metal silicide layers are disposed in the first trench. The upper and lower ones of the polysilicon layers or metal silicide layers are disposed in parallel, and the first insulating layer is disposed in the first trench. The first P-type protective layer is grounded and disposed on a bottom of the first trench, and the first P-type protective layer contacts the first insulating layer and a bottom surface of the lower one of the polysilicon layers or metal silicide layers. The metal layer is respectively disposed as a top surface and a lower bottom surface of the semiconductor structure to form a source and a drain, respectively, as electrodes for the semiconductor structure to be connected to an external device. The metal layer covers the first trench, and a Schottky junction is formed at a junction of the metal layer and a top of the first N-type semiconductor layer. An electron accumulated region is formed outside the first insulating layer. An interface between a bottom surface of the first P-type protective layer and the first N-type semiconductor layer has a PN junction. The polysilicon layer may also be a silicide layer, or a combination of a polysilicon layer and a silicide layer.

DETAILED DESCRIPTION OF THE INVENTION

Figure 1:
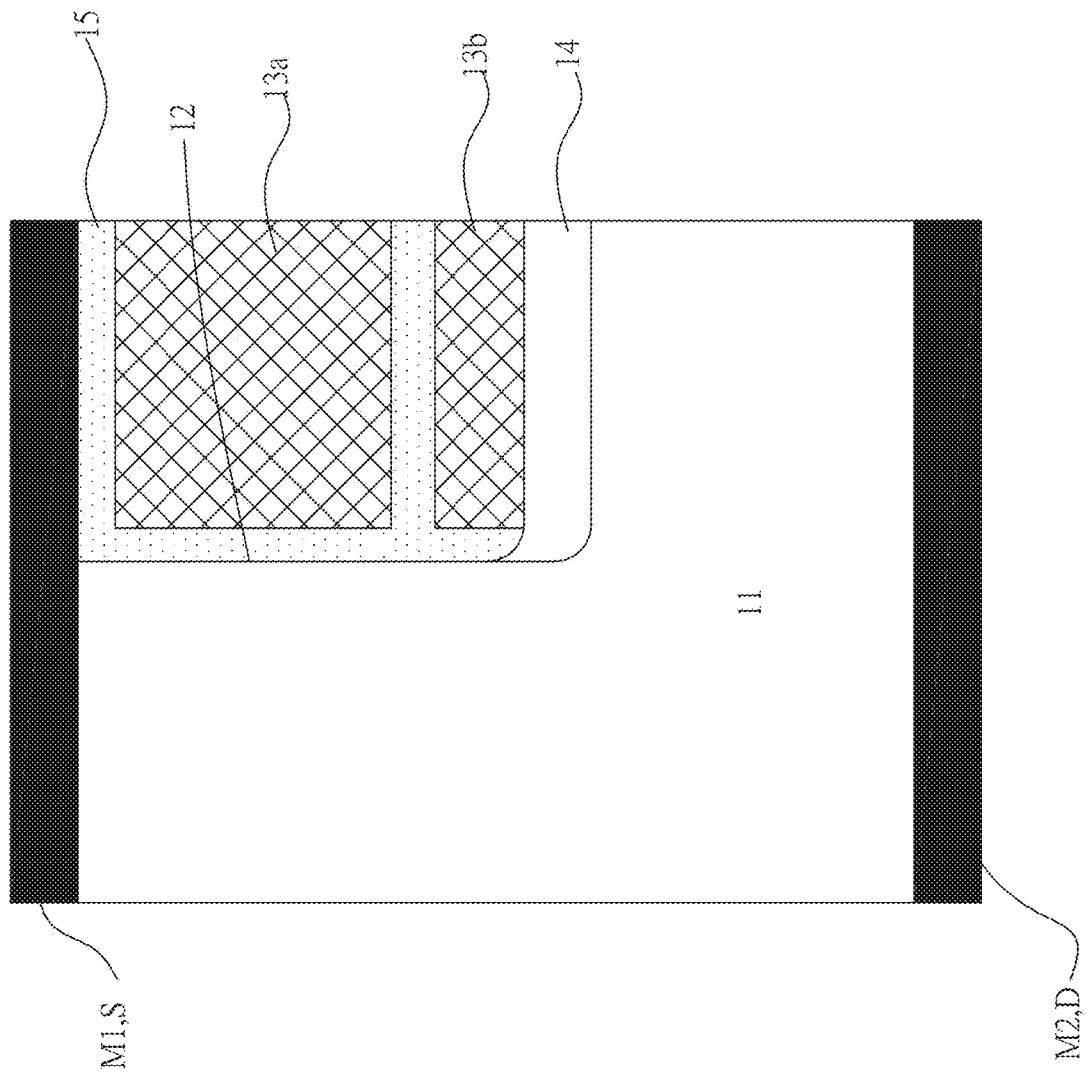
FIGS. 1 to 3 are partial schematic views showing semiconductor structures according to an embodiment of this disclosure.

FIG. 1 is a partial schematic view showing a semiconductor structure according to an embodiment of this disclosure. A semiconductor structure includes a Schottky diode structure 10 including a first N-type semiconductor layer 11, a first trench 12, polysilicon layers or metal silicide layers 13a and 13b, a first P-type protective layer 14, a first insulating layer 15 and metal layers M1 and M2 forming a combination that may be referred to as a metal layer.

The first trench 12 extends through the first N-type semiconductor layer 11, and is disposed in the first N-type semiconductor layer 11. In one embodiment, the first trench 12 may be regarded as a notch of the first N-type semiconductor layer 11.

The first P-type protective layer 14 is to be grounded and disposed on a bottom of the first trench 12. In one embodiment, the first P-type protective layer 14 covers the bottom of the first trench 12, and a partial top surface of the first P-type protective layer 14 respectively contacts the first insulating layer 15 and a bottom surface of the lower polysilicon layer or metal silicide layer 13b. In other words, the first P-type protective layer 14, the polysilicon layers or metal silicide layers 13a and 13b are sequentially filled into the first trench 12, and other portions of the first trench 12 are filled with the first insulating layer 15.

In this embodiment, the upper and lower polysilicon layers or metal silicide layers 13a and 13b are disposed in parallel with a gap formed therebetween. That is, no contact"

is formed between the upper polysilicon layer or silicide layer 13*a* and the lower polysilicon layer or silicide layer 13*b*.

Please note that the polysilicon layers or silicide layers 13*a* and 13*b* may be respectively applied with different voltages to change electroconductive properties of the polysilicon layers or silicide layers 13*a* and 13*b*. In addition, this disclosure does not intend to restrict the polysilicon layers or silicide layers 13*a* and 13*b* to N-type or P-type semiconductor layers.

The metal layers M1 and M2 are respectively disposed as a top surface and a lower bottom surface of the semiconductor structure 100 to form a source S and a drain D as electrodes for the semiconductor structure 100 to be connected to an external device. The metal layer M1 covers the first N-type semiconductor layer 11 and the first trench 12, a junction of the metal layer M1 and a top of the first N-type semiconductor layer 11 has a Schottky junction, and an electron accumulated region is formed outside the first insulating layer 15 or in the first N-type semiconductor layer 11 outside the first trench 12. An interface between a bottom surface of the first P-type protective layer 14 and the first N-type semiconductor layer 11 has a PN junction.

The first P-type protective layer 14 is disposed on the first insulating layer 15 or a bottom surface of the first trench 12, and the first P-type protective layer 14 does not cover a sidewall of the first insulating layer 15 or a sidewall of the first trench 12. A width of the first P-type protective layer 14 is smaller than or equal to a width of the bottom surface of the first trench 12. Consequently, a Schottky junction gap of the Schottky diode structure is increased to increase a forward current value.

Figure 2:
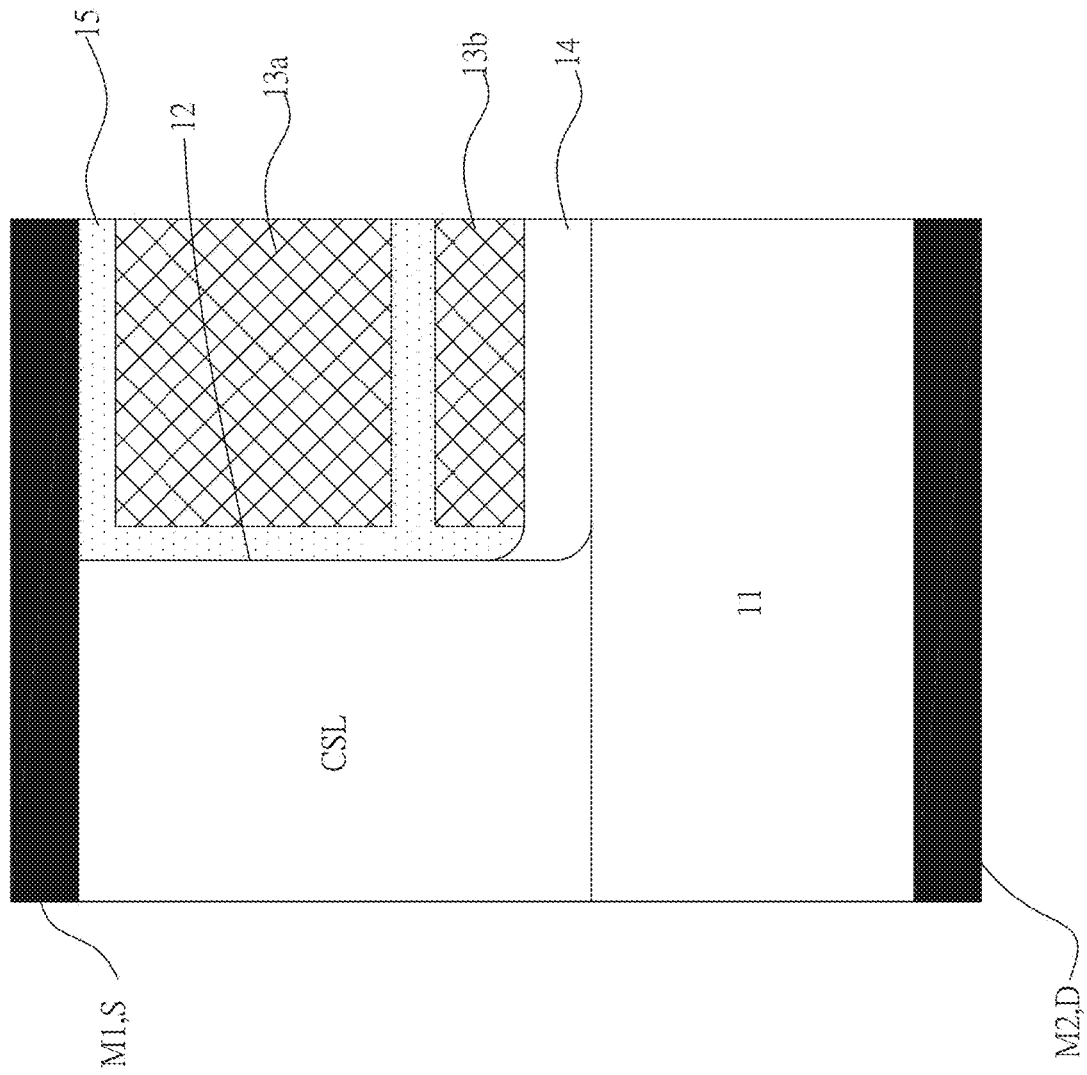

FIG. 2 is a partial schematic view showing a semiconductor structure according to an embodiment of this disclosure. Referring to FIGS. 2 and 1 concurrently, a Schottky diode structure 20 differs from the Schottky diode structure 10 in that a portion of the N-type semiconductor layer 11 is an N-type current spreading layer CSL in the Schottky diode structure 20. The N-type current spreading layer CSL is disposed outside the first trench 12, and contacts the first insulating layer 15 and the first P-type protective layer 14, and a top surface of the N-type current spreading layer CSL is covered by the metal layer M1.

In one embodiment, the N-type current spreading layer CSL has an N-type semiconductor doping concentration higher than the first N-type semiconductor layer 11, so that a resistance value of the Schottky diode structure 20 is decreased.

Figure 3:
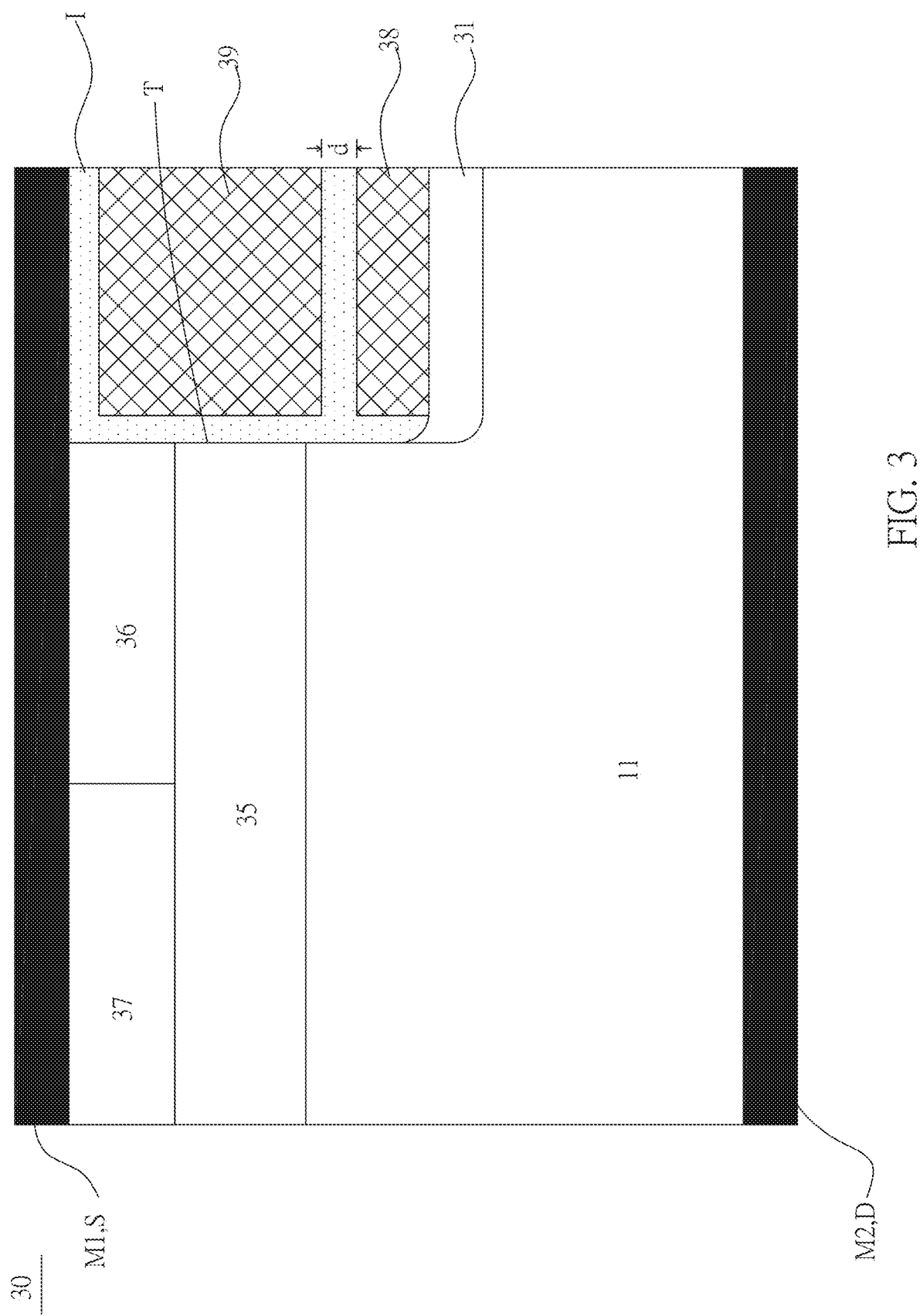

FIG. 3 is a partial schematic view, showing a semiconductor structure according to an embodiment of this disclosure. Referring next to FIG. 3, a U-metal-oxide-semiconductor field-effect transistor (LIMOS) structure 30 includes: metal layers M1 and M2, a first N-type semiconductor layer 11, a P-well 35, a second N-type semiconductor layer 36, a P-type semiconductor layer 37, a second trench T, a second insulating layer I, a split gate 38, a gate 39, and a second P-type semiconductor protective layer 31.

The metal layers M1 and M2 are disposed as a top surface and a bottom surface of the structure 30 to form a source S and a drain D, respectively, as electrodes for the structure 30 to be connected to an external device. The first N-type semiconductor layer 11 is disposed on the drain D. The P-well 35 is disposed on the first N-type semiconductor layer 11. The second N-type semiconductor layer 36 is disposed on the P-well 35. The P-type semiconductor layer 37 is adjacent to the second N-type semiconductor layer 36 and is disposed on the P-well 35. The trench T extends downwards through the second N-type semiconductor layer 36, the P-well 35, and the first N-type semiconductor layer 11. Finally, a bottom of the trench T terminates at the first N-type semiconductor layer 11.

Please note that, in this embodiment, a second P-type protective layer 31 is formed below the bottom of the trench T by way of ion implantation, and is adjacent to the first N-type semiconductor layer 11. In this embodiment, a bottom surface of the split gate 38 contacts an upper edge or an upper bottom surface of the second P-type protective layer 31. The second P-type protective layer 31 protects the second insulating layer I from being damaged by a breakdown electric-field when the LIMOS structure 30 is turned off and biased. In addition, the second P-type protective layer 31 and the split gate 38 are grounded to prevent the second P-type protective layer 31 and the split gate 38 from generating leakage currents.

The second P-type protective layer 31 and the split gate 38 are grounded because the second P-type protective layer 31 and the split gate 38 having the equal potentials can prevent the second P-type protective layer 31 and the split gate 38 from generating the leakage currents.

The second insulating layer I is disposed in or within the second trench T, and respectively adjacent to the second N-type semiconductor layer 36, the P-well 35, the first N-type semiconductor layer 11 and the second P-type protective layer 31. The split gate 38 is disposed in the second insulating layer I of the second trench T, and the gate 39 is disposed in the second insulating layer of the second trench T and above the split gate 38. The second insulating layer I separates the gate 39 from the split gate 38 by a predetermined gap d. A bottom depth position of the gate 39 is deeper than that of the interface between the P-well 35 and the first N-type semiconductor layer 11. In one embodiment, the gate 39 and the split gate 38 may be regarded as being covered by the second insulating layer I. The second insulating layer I is implemented by a semiconductor oxide or a semiconductor nitride. The split gate 38 and the gate 39 are implemented by a polysilicon or silicide, and the split gate 38 and the gate 39 may be implemented by a P-type or N-type polysilicon or silicide.

In one embodiment, the LIMOS structure 30 is a UMOS-FET structure using a silicon carbide, the second insulating layer I is disposed above the second P-type protective layer 31, and a bottom surface of the split gate 38 contacts a top surface of the second P-type protective layer 31.

In one embodiment, the first P-type protective layer 14 or the second P-type protective layer 31 is implemented by at least one of the materials of silicon carbide (SiC), gallium nitride (GaN) and silicon.

Figure 4A:
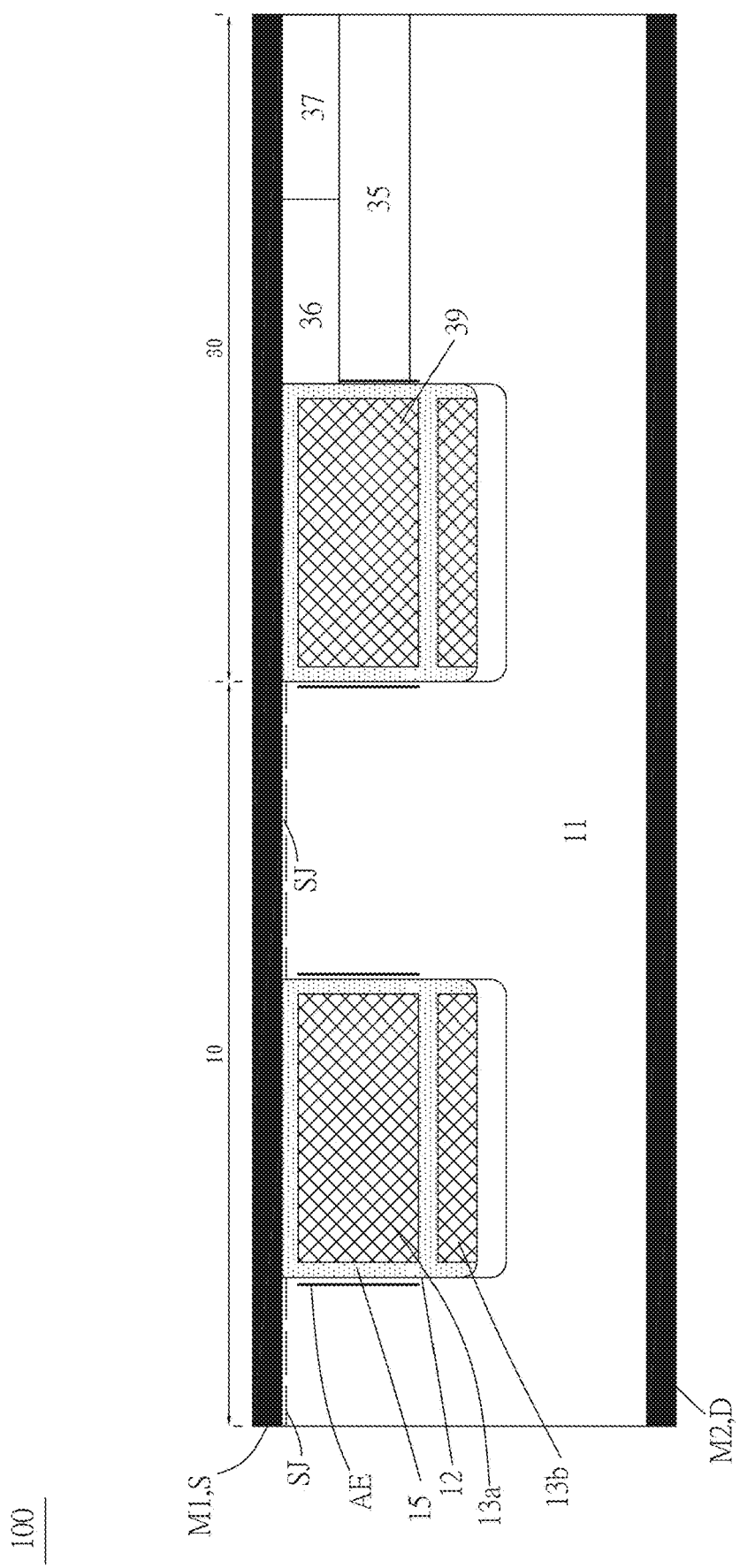
FIG. 4A is a schematic view showing a semiconductor structure 100 after a Schottky diode structure 10 and a LIMOS structure 30 have been combined.

FIG. 4A is a schematic view showing the semiconductor structure 100 after the Schottky diode structure 10 and the LIMOS structure 30 have been combined. Referring next to FIG. 4A, the upper polysilicon layer or metal silicide layer 13*a* functions as a gate, and the polysilicon layer or metal silicide layer 13*a* is coupled to the gate 39 of the UMOS structure 30. The upper metal layer M1 extends to cover the P-type semiconductor layer 37 and the second N-type semiconductor layer 36. The upper polysilicon layer or metal silicide layer 13*a* and the gate 39 are disposed on the same horizontal surface, and the lower polysilicon layer or metal silicide layer 13*b* and the split gate 38 are disposed on the same horizontal surface. The polysilicon layers or metal silicide layers 13*a* and 13*b* may be implemented by the P-type or N-type polysilicon or silicide.

In this embodiment, the position of a Schottky junction SJ is at a junction of the metal layer M1 and a top of the first N-type semiconductor layer 11, as shown by dashed lines. In addition, a position of the electron accumulated region AE is shown by thick line segments. Please note that the electron accumulated region AE of the LIMOS structure 30 is generated at the position below the second N-type semiconductor layer 36 and disposed on a horizontal surface substantially the same as the gate 39. The electron accumulated region AE of the Schottky diode structure 10 is formed outside the first insulating layer 15 or in the first trench 12 outside the first N-type semiconductor layer 11. The electron accumulated region AE and the upper polysilicon layer or metal silicide layer 13a are disposed on a substantially the same horizontal surface, but the electron accumulated region AE is not formed on an inner side of the first trench 12.

Please note that the electron accumulated region AE is generated by way of induction after the polysilicon layer or metal silicide layer 13a and the gate 39 have been applied with a positive voltage, so the electron accumulated region AE is generated outside the first insulating layer 15 or in the first trench 12 outside the first N-type semiconductor layer 11, and at the position below the second N-type semiconductor layer 36 and at the horizontal surface substantially the same as the gate 39. The electron accumulated region AE generated can enhance the conductivity of the semiconductor structure 100.

Figure 4B:
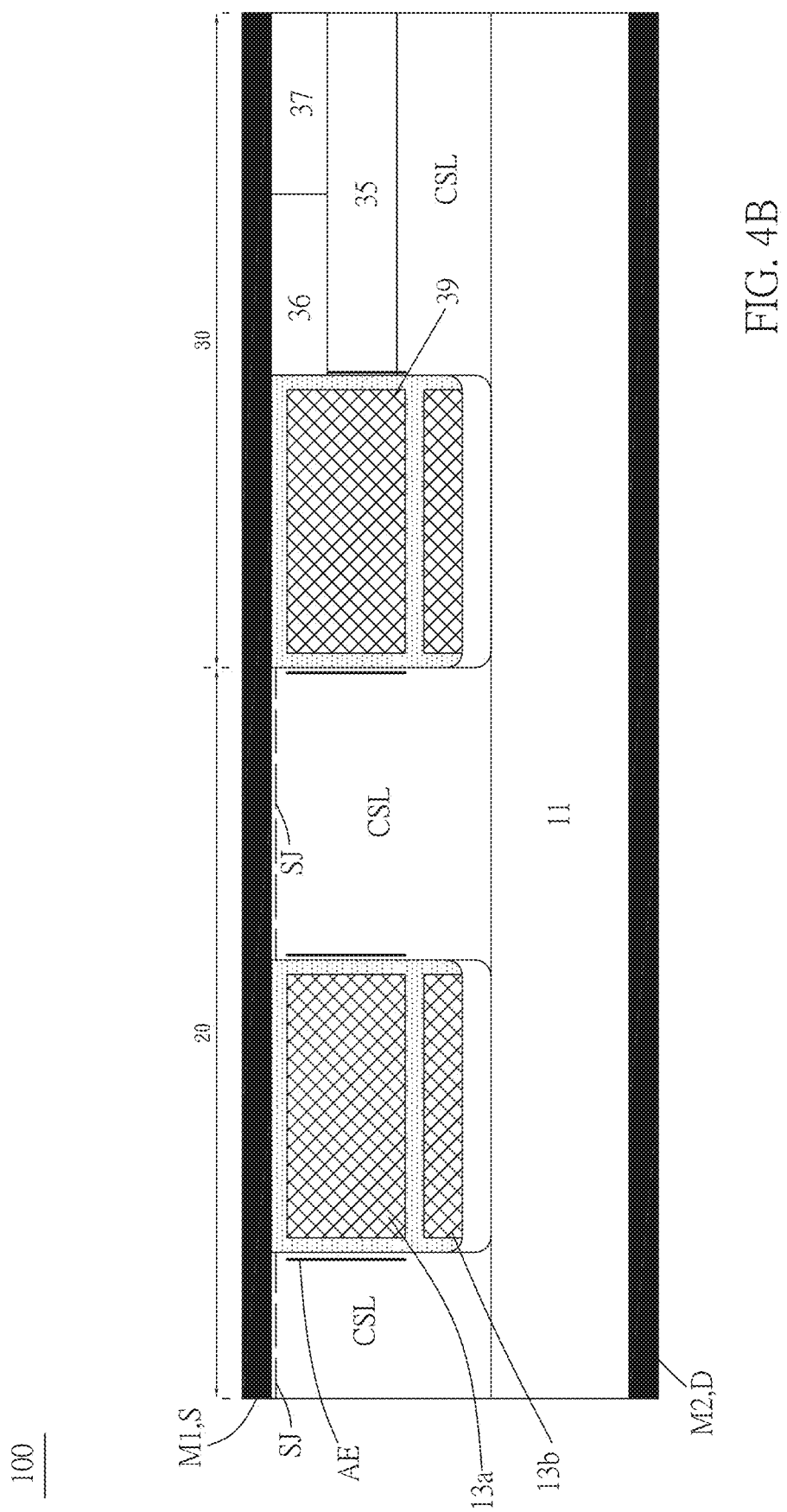
FIG. 4B is a schematic view showing the semiconductor structure 100 after a Schottky diode structure 20 and the LIMOS structure 30 have been combined.

FIG. 4B is a schematic view showing the semiconductor structure 100 after the Schottky diode structure 20 and the LIMOS structure 30 have been combined. Referring next to FIG. 4B of this embodiment, the difference between FIGS. 4B and 4A resides in that a portion of the N-type semiconductor layer 11 in the Schottky diode structure 20 is an N-type current spreading layer CSL, and other principles are the same.

Figure 5:
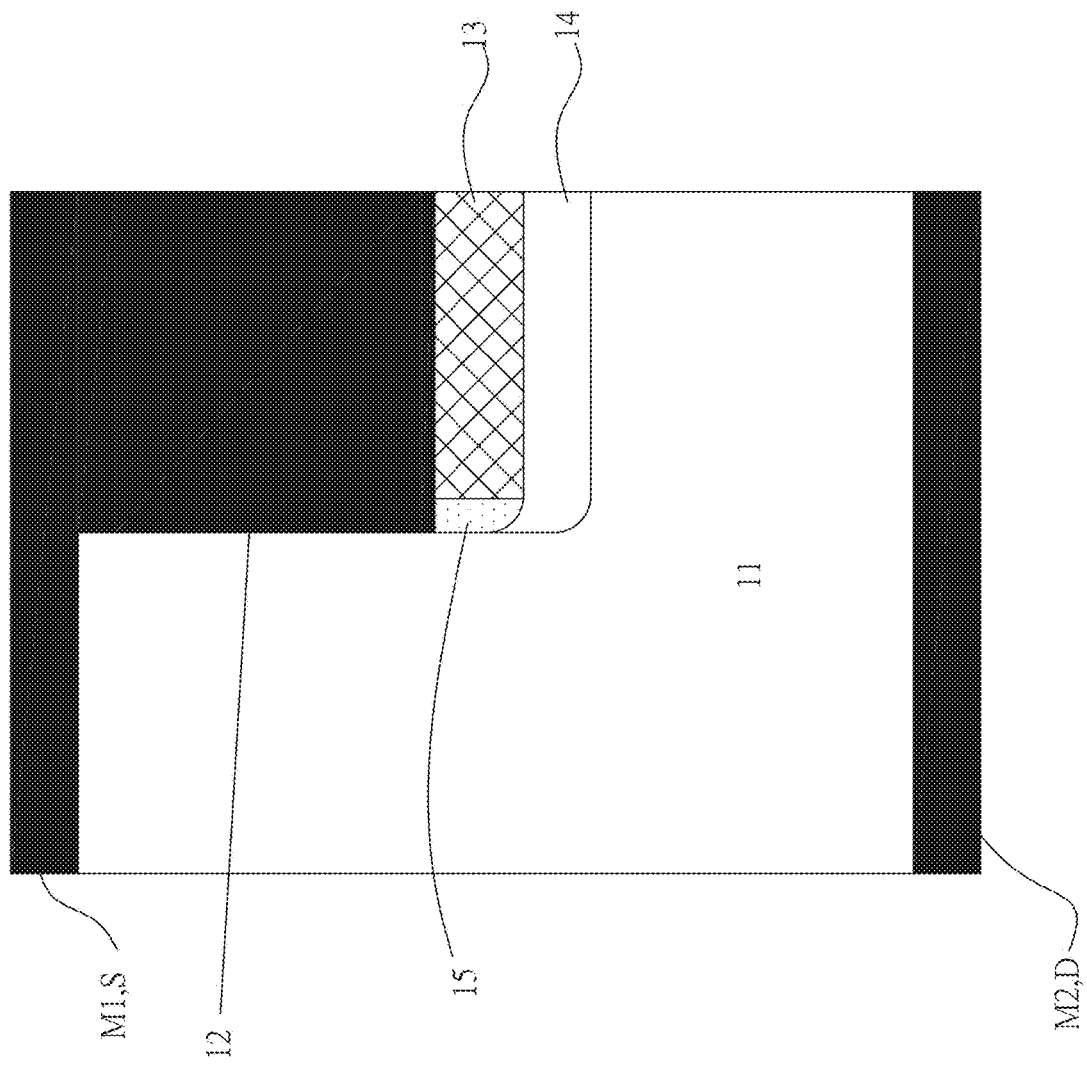
FIGS. 5 and 6 are partial schematic views showing semiconductor structures according to an embodiment of this disclosure.

FIG. 5 is a partial schematic view showing a semiconductor structure according to an embodiment of this disclosure. The semiconductor structure 100 includes a Schottky diode structure 50, which further includes a first N-type semiconductor layer 11, a first trench 12, polysilicon layers 13a and 13b, a first P-type protective layer 14, a first insulating layer 15 and metal layers M1 and M2.

Please note that the polysilicon layers or metal silicide layers 13a and 13b in this embodiment are closely configured into one entity, and no gap is present between the polysilicon layers or metal silicide layers 13a and 13b. In other words, the Schottky diode structure 50 in the first trench 12 may be regarded as having only one polysilicon layer or metal silicide layer 13, which is implemented by the P-type or N-type polysilicon or silicide.

In addition, the metal layer M1 above the first trench 12 extends into the first trench 12, and the metal layer M1 in the first trench 12 contacts the top surface of the upper polysilicon layer or metal silicide layer 13a (or 13) and the first insulating layer 15.

In one embodiment, the sidewall W of the metal layer M1 in the first trench 12 and the bottom of the metal layer M1 above the first N-type semiconductor layer 11 form an L-shaped structure. Consequently, the metal content of the Schottky diode structure 50 is higher than that of the metal layer M1 of the Schottky diode structure 10, so the current diffusion ability is also increased.

Figure 6:
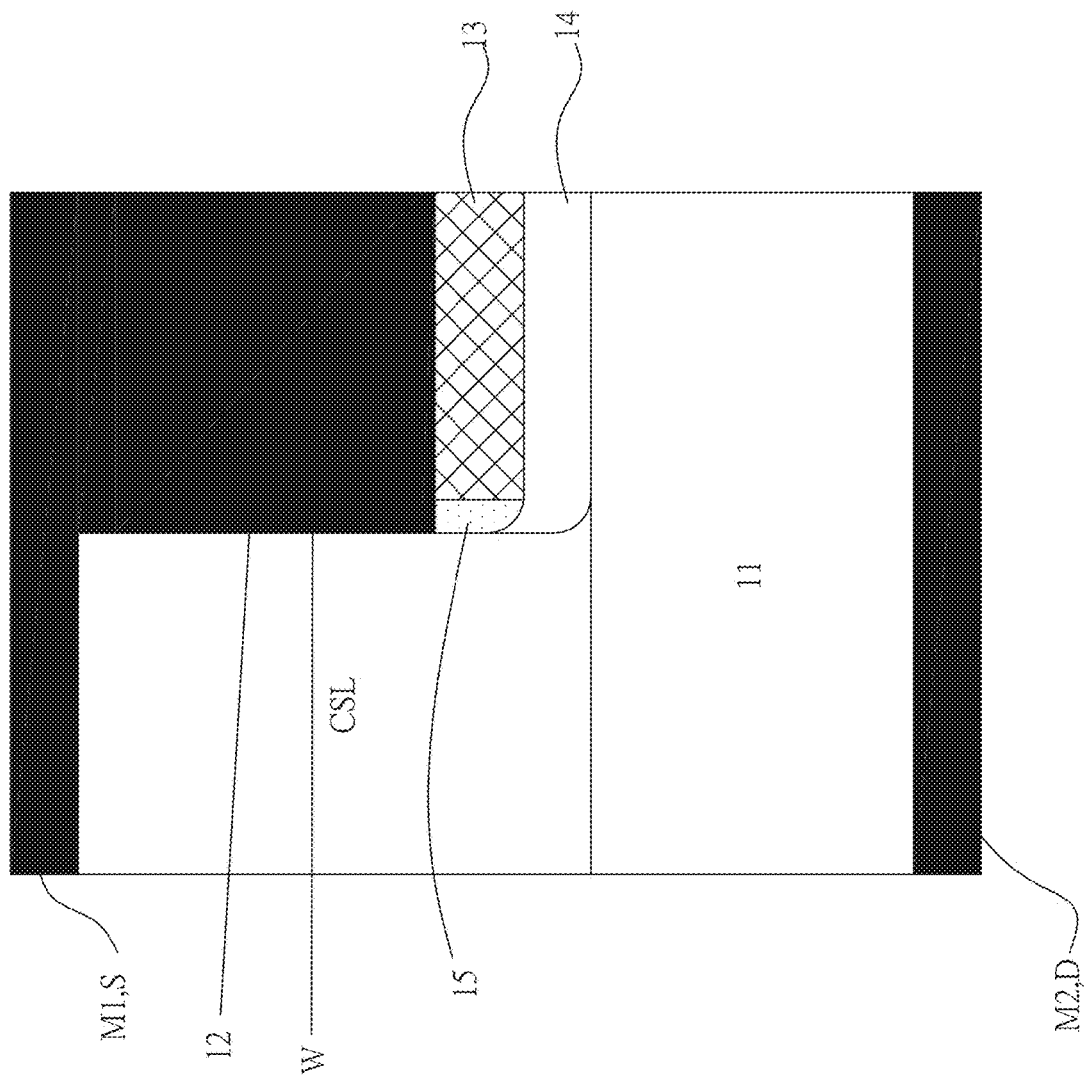

FIG. 6 is a partial schematic view showing a semiconductor structure according to an embodiment of this disclosure. Referring next to FIG. 6, a Schottky diode structure 60 differs from the Schottky diode structure 50 in that a portion of the N-type semiconductor layer 11 in the Schottky diode structure 60 is an N-type current spreading layer CSL, which is disposed outside the first trench 12, and contacts the first insulating layer 15 and the first P-type protective layer 14, wherein a top surface of the N-type current spreading layer CSL is covered by the metal layer M1 and contacts a sidewall W of the metal layer M1.

In one embodiment, adjacent portions of the Schottky junction SJ of the Schottky diode structure 50 form an included angle approximating 90 degrees. In other words, the adjacent portions of the Schottky junction SJ of the Schottky diode structure 50 form a ladder-like structure, and the junctions of the metal layer M1 and the top and the sidewall W of the first N-type semiconductor layer 11 have the Schottky junctions SJ, so the areas of the Schottky junction SJ in the Schottky diode structure 60 and the Schottky diode structure 50 are increased, and the positions of the Schottky junctions SJ are shown in FIGS. 7A and 7B.

Figure 7A:
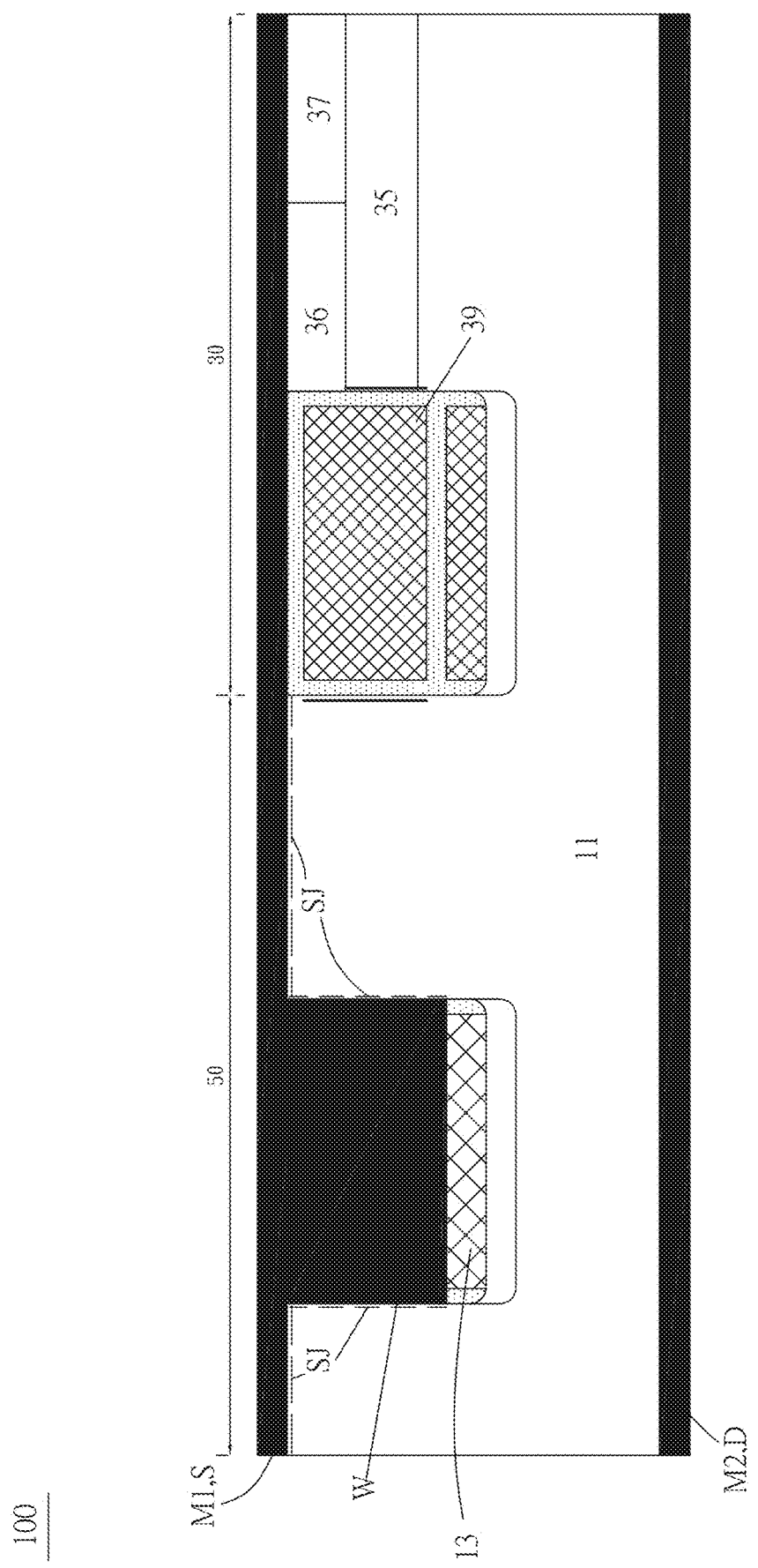
FIG. 7A is a schematic view showing the semiconductor structure 100 after a Schottky diode structure 50 and the LIMOS structure 30 have been combined.
Figure 7B:
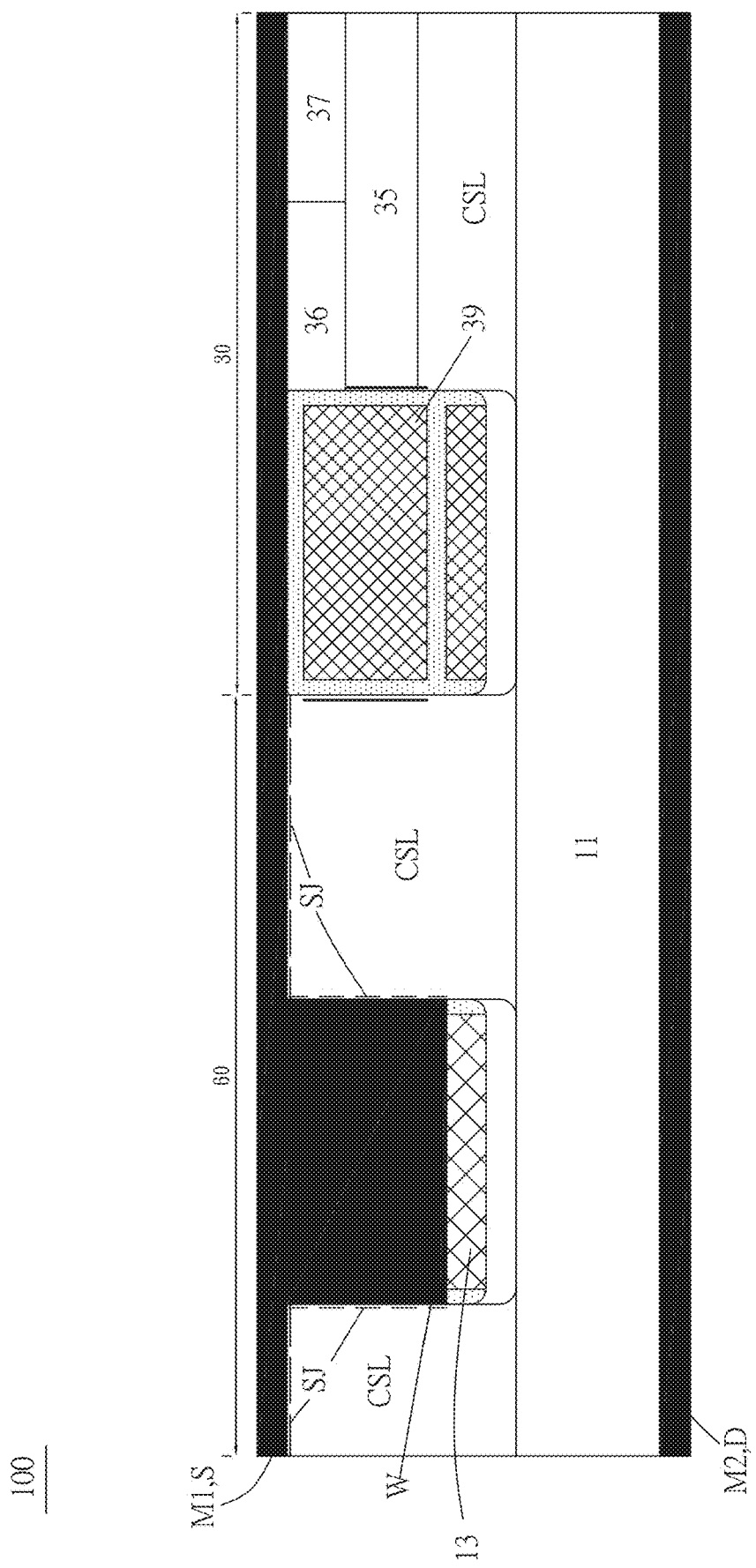
FIG. 7B is a schematic view showing the semiconductor structure 100 after a Schottky diode structure 60 and the LIMOS structure 30 have been combined.

FIG. 7A is a schematic view showing the semiconductor structure 100 after the Schottky diode structure 50 and the LIMOS structure 30 have been combined. Referring to FIG. 7A, the metal layer M1 is shown in FIG. 5 and extends into the first trench 12, and the metal layer M1 in the first trench 12 contacts the top surface of the polysilicon layer or metal silicide layer 13, wherein the polysilicon layer or metal silicide layer 13 and the split gate 38 are disposed on the same horizontal surface. In this embodiment, the Schottky diode structure 50 has no gate.

In this embodiment, the Schottky junction SJ is located at the top junction of the metal layer M1 and the first N-type semiconductor layer 11, and at the junction of the sidewall W of the metal layer M1 and the first N-type semiconductor layer 11, as shown by the dashed-line frames. In addition, the position of the electron accumulated region AE is shown by thick line segments. Please note that the electron accumulated region AE of the LIMOS structure 30 is generated at the position below the second N-type semiconductor layer 36 and is located at a horizontal surface substantially the same as the gate 39.

Please note that the electron accumulated region AE is generated by way of induction after the gate 39 has been applied with the positive voltage, so the electron accumulated region AE is generated at the position below the second N-type semiconductor layer 36 and on a horizontal surface substantially the same as the gate 39.

FIG. 7B is a schematic view showing the semiconductor structure 100 after the Schottky diode structure 60 and the LIMOS structure 30 have been combined. Referring next to FIG. 7B of this embodiment, the difference between FIGS. 7B and 7A resides in that a portion of the N-type semiconductor layer 11 in the Schottky diode structure 20 is an N-type current spreading layer CSL, and other principles are the same.

Figure 8A:
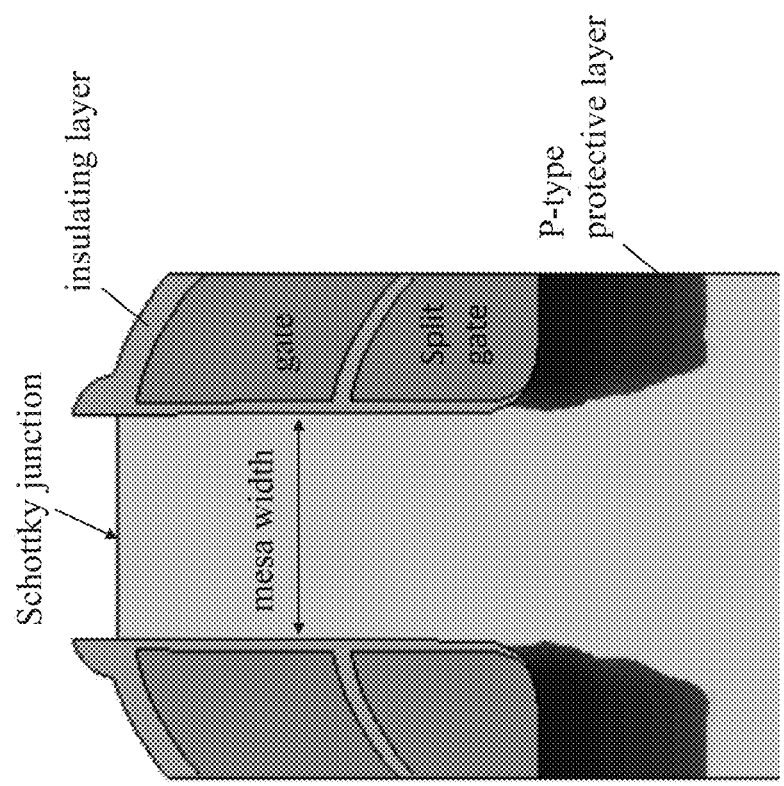
FIG. 8A is a schematic view showing an implementation of FIG. 4A.

FIG. 8A is a schematic view showing an implementation of FIG. 4A. Referring to FIG. 8A, a mesa width is a distance between the adjacent insulating layers of the Schottky diode structure 10 and the LIMOS structure 30.

Figure 8B:
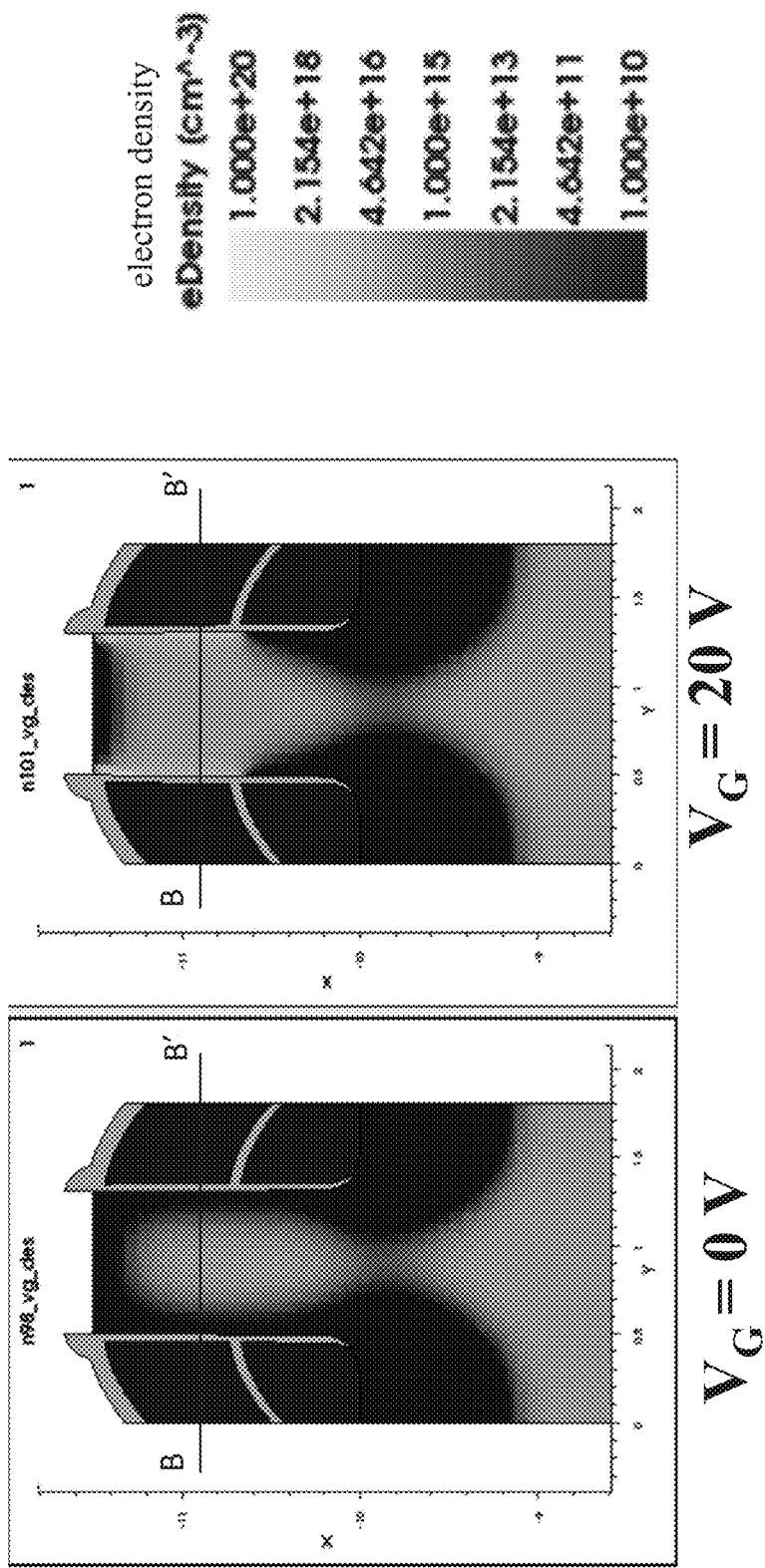
FIG. 8B shows electron distribution diagrams before and after the gate is applied with a voltage.

FIG. 8B shows electron distribution diagrams before and after the gate is applied with the voltage, wherein the mesa width is equal to 0.8 microns (um). After the gate has been applied with the voltage $V_G = 20V$, the electron density (eDensity) at the position of the line segment B-B' near the insulating layer is increased from $1\ e^{10}\ cm^{-3}$ to $1\ e^{20}\ cm^{-3}$. So, the structure of this disclosure can increase the electron density within the mesa width after the gate has applied with the voltage.

Figure 8C:
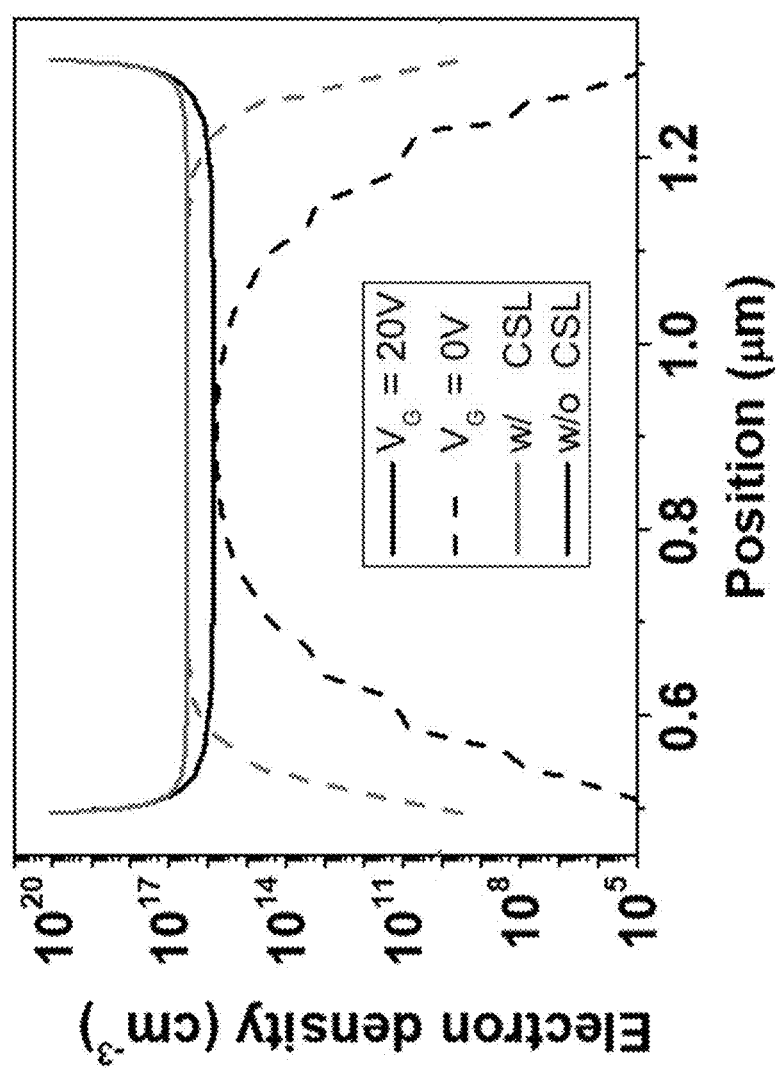
FIG. 8C is a schematic graph showing the electronic densities at the line segment B-B' before and after the gate is applied with the voltage.

FIG. 8C is a schematic graph showing the electronic densities at the line segment B-B' before and after the gate is applied with the voltage. Similarly, referring to FIG. 8C, the gray curve represents that the structure has the current spreading layer (the structure of FIG. 4B), the black curve represents that the structure has no current spreading layer (the structure of FIG. 4A), the continuous curve represents that the gate has been applied with the voltage, and the discontinuous curve represents that the gate has not been applied with the voltage. Referring to the black curve when no voltage has been applied to the gate, the center region of the first N-type semiconductor layer has the highest electron density, and the electron density gradually decreases to the insulating layer. After the gate has been applied with the voltage, the electron density within the mesa width of the first N-type semiconductor layer is higher than that when no voltage is applied to the gate, and the electron density becomes uniform within the mesa width, and gradually increases to the sidewall of the insulating layer, where the highest electron density is present. Similarly, the gray continuous and discontinuous curves also have the similarly trend, but the gray curve of the structure having the current spreading layer has the higher electron density.

Figure 8D:
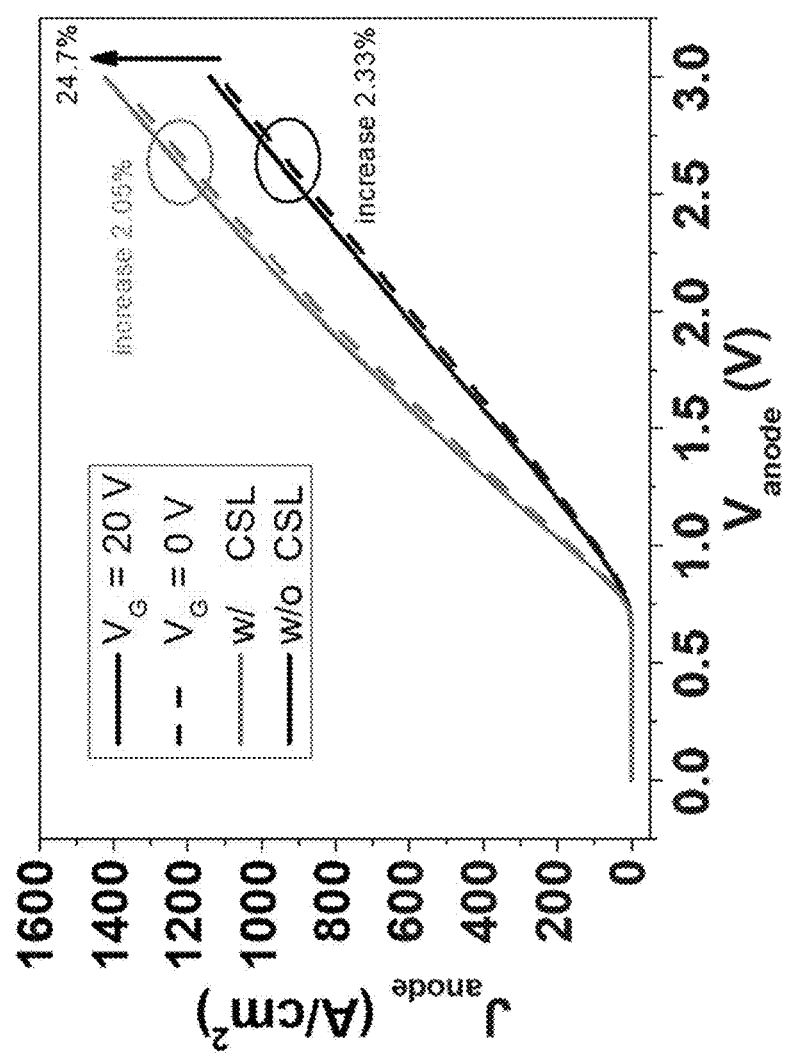
FIG. 8D is a graph showing an anode current density versus a voltage.

FIG. 8D is a graph showing an anode current density versus a voltage. Referring to FIG. 8D, the gray curve represents that the structure has the current spreading layer (the structure of FIG. 4B), and the black curve represents that the structure has no current spreading layer (the structure of FIG. 4A), the continuous curve represents that the gate has been applied with the voltage, and the discontinuous curve represents that no voltage is applied to the gate. Referring to the black curve, the current density is increased by 2.33% after the gate has been applied with the voltage. Similarly, referring to the gray curve, the current density is increased by 2.05% after the gate has been applied with the voltage, and the current density of the structure having the current spreading layer is further increased by 24.7%.

In summary, the semiconductor structure of this disclosure provides the following functions. First, the Schottky junction of the Schottky diode structure is provided. Second, the P-type protective layer is grounded to the top metal or electrode. Third, the embedded PN has the better surge current capability.

What is claimed is:
1. A semiconductor structure, comprising a Schottky diode structure, the Schottky diode structure comprising:
    a first N-type semiconductor layer;
    a first trench extending through the first N-type semiconductor layer and being disposed in the first N-type semiconductor layer;
    a first insulating layer disposed in the first trench;
    at least two polysilicon layers or metal silicide layers disposed in the first trench, wherein an upper one of the polysilicon layers or the metal silicide layers and a lower one of the polysilicon layers or the metal silicide layers are disposed in parallel, and the first insulating layer is disposed within the first trench;
    a first P-type protective layer, which is grounded and disposed on a bottom of the first trench, and contacts the first insulating layer and a bottom surface of the lower one of the polysilicon layers or the metal silicide layers; and
    a metal layer respectively disposed as a top surface and a lower bottom surface of the semiconductor structure to form a source and a drain as electrodes for the semiconductor structure to be connected to an external device, wherein the metal layer covers the first trench, and a Schottky junction is formed at a junction of the metal layer and a top of the first N-type semiconductor layer;
    wherein an interface between a bottom surface of the first P-type protective layer and the first N-type semiconductor layer has a PN junction; the first P-type protective layer is disposed on the first insulating layer or a bottom surface of the first trench, the first P-type protective layer does not cover a sidewall of the first insulating layer or a sidewall of the first trench, and a width of the first P-type protective layer is smaller than or equal to a width of the bottom surface of the first trench; the two polysilicon layers or metal silicide layers in the Schottky diode structure are covered by the first insulating layer; and an electron accumulated region is formed outside the first insulating layer, the electron accumulated region and the upper one of the polysilicon layers or the metal silicide layers are located on substantially a same horizontal surface, and the metal layer contacts the first N-type semiconductor layer and a top surface of the first insulating layer in the first trench.

2. The semiconductor structure according to claim 1, wherein the semiconductor structure comprises a U-metal-oxide-semiconductor field-effect transistor (UMOS) structure, wherein the first N-type semiconductor layer is disposed on the drain, and the UMOS structure comprises:
    a P-well disposed on the first N-type semiconductor layer;
    a second N-type semiconductor layer disposed on the P-well;
    a P-type semiconductor layer, which is adjacent to the second N-type semiconductor layer and disposed on the P-well;
    a second trench extending through the second N-type semiconductor layer, the P-well and the first N-type semiconductor layer, wherein a bottom of the second trench terminates at the first N-type semiconductor layer;
    a second insulating layer disposed in the second trench;
    a split gate, which is disposed in the second insulating layer of the second trench, and covered by the second insulating layer;
    a gate disposed in the second insulating layer of the second trench and above the split gate; and
    a second P-type protective layer disposed on the bottom of the second trench and adjacent to the first N-type semiconductor layer, wherein the second insulating layer is disposed above the second P-type protective layer, and protects the second insulating layer from being broken through by an electric field when the UMOS structure is turned off and biased;
    wherein the second insulating layer separates the gate from the split gate by a predetermined gap; a bottom depth position of the gate is deeper than an interface between the P-well and the N-type semiconductor layer; and a bottom surface of the split gate contacts a top surface of the second P-type protective layer; and there is no space between the two polysilicon layers or metal silicide layers.

3. The semiconductor structure according to claim 2, wherein a portion of the first N-type semiconductor layer is an N-type current spreading layer (CSL), the N-type current spreading layer is disposed outside the first trench or outside the second trench, the N-type current spreading layer contacts the first insulating layer and the first P-type protective layer, and a top surface of the N-type current spreading layer is covered by the metal layer.

4. The semiconductor structure according to claim 3, wherein an upper portion of the metal layer extends to cover the P-type semiconductor layer and the second N-type semiconductor layer, the upper one of the polysilicon layers or the metal silicide layers and the gate are disposed on a same horizontal surface, and the lower one of the polysilicon layers or the metal silicide layers and the split gate are disposed on a same horizontal surface.

5. The semiconductor structure according to claim 4, wherein the polysilicon layers or the metal silicide layers, the gate, the split gate are implemented by a P-type or an N-type polysilicon or silicide.

6. The semiconductor structure according to claim 2, wherein the first P-type protective layer or the second P-type protective layer is implemented by at least one of a silicon carbide, a gallium nitride and a silicon.

7. The semiconductor structure according to claim 1, wherein the two polysilicon layers or metal silicide layers are closely configured into one entity, and no gap is present between the two polysilicon layers or metal silicide layers; the metal layer above the first trench extends into the first trench, and the metal layer in the first trench contacts a top surface of the upper one of the polysilicon layers or the metal silicide layers and the first insulating layer.

8. The semiconductor structure according to claim 7, wherein a sidewall of the metal layer in the first trench and a bottom of the metal layer above the first N-type semiconductor layer form an L-shaped structure.

9. The semiconductor structure according to claim 7, wherein adjacent portions of the Schottky junction of the Schottky diode structure form an included angle.

10. The semiconductor structure according to claim 9, wherein the adjacent portions of the Schottky junction of the Schottky diode structure form a ladder-like structure.

11. The semiconductor structure according to claim 10, wherein junctions of the metal layer and a top and a sidewall of the first N-type semiconductor layer have the Schottky junction.

12. The semiconductor structure according to claim 11, wherein the semiconductor structure comprises a U-metal-oxide-semiconductor field-effect transistor (UMOS) structure, wherein the first N-type semiconductor layer is disposed on the drain, and the UMOS structure comprises:

a P-well disposed on the first N-type semiconductor layer;
a second N-type semiconductor layer disposed on the P-well;
a P-type semiconductor layer, which is adjacent to the second N-type semiconductor layer and disposed on the P-well;
a second trench extending through the second N-type semiconductor layer, the P-well and the first N-type semiconductor layer, wherein a bottom of the second trench terminates at the first N-type semiconductor layer;
a second insulating layer disposed in the second trench;
a split gate, which is disposed in the second insulating layer of the second trench, and covered by the second insulating layer;
a gate disposed in the second insulating layer of the second trench and above the split gate; and
a second P-type protective layer disposed on the bottom of the second trench and adjacent to the first N-type semiconductor layer, wherein the second insulating layer is disposed above the second P-type protective layer, and protects the second insulating layer from being broken through by an electric field when the UMOS structure is turned off and biased;
wherein the second insulating layer separates the gate from the split gate by a predetermined gap; and a bottom depth position of the gate is deeper than an interface between the P-well and the first N-type semiconductor layer; and a bottom surface of the split gate contacts a top surface of the second P-type protective layer.

13. The semiconductor structure according to claim 12, wherein the first P-type protective layer or the second P-type protective layer is implemented by at least one of a silicon carbide, a gallium nitride and a silicon.

14. The semiconductor structure according to claim 12, wherein the polysilicon layers or the metal silicide layers, the gate, the split gate are implemented by a P-type or an N-type polysilicon or silicide.

* * * * *